United States Patent
Szettella et al.

(10) Patent No.: US 6,550,126 B1
(45) Date of Patent: Apr. 22, 2003

(54) METHOD FOR MOUNTING ELECTRODE ASSEMBLY

(75) Inventors: Joseph Mitchell Szettella, San Antonio, TX (US); Jeffery Ozee, San Antonio, TX (US); Augusto James Gonzales, San Antonio, TX (US)

(73) Assignees: Sony Electronics, Inc, Park Ridge, NJ (US); Sony Corporation (JP)

( * ) Notice: Subject to any disclaimer, the term of this patent is extended or adjusted under 35 U.S.C. 154(b) by 396 days.

(21) Appl. No.: 09/124,831

(22) Filed: Jul. 30, 1998

(51) Int. Cl.[7] ................................. B23Q 3/00
(52) U.S. Cl. .................... 29/464; 29/465; 29/525.11
(58) Field of Search ................ 29/464, 465, 525.01, 29/525.11, DIG. 16; 403/13, 14

(56) References Cited

U.S. PATENT DOCUMENTS

| | | | | |
|---|---|---|---|---|
| 3,203,082 A | * | 8/1965 | Robbins | 29/525.11 |
| 3,979,994 A | * | 9/1976 | Collignon | 403/13 |
| 4,625,385 A | * | 12/1986 | Kohler et al. | 29/464 |
| 5,004,017 A | * | 4/1991 | White | 29/464 |
| 5,256,019 A | * | 10/1993 | Phillips | 29/525.11 |
| 5,275,963 A | * | 1/1994 | Cederbaum et al. | 437/48 |
| 5,565,356 A | * | 10/1996 | Lenz et al. | 156/345 |
| 5,590,474 A | * | 1/1997 | Lamb | 29/464 |
| 5,728,254 A | * | 3/1998 | Jeng | 156/345 |

FOREIGN PATENT DOCUMENTS

JP    63-260732    * 10/1988    ........... 29/464

* cited by examiner

Primary Examiner—A. Dexter Tugbang
(74) Attorney, Agent, or Firm—Rader, Fishman, & Grauer PLLC; Ronald P. Kananen, Esq.

(57) ABSTRACT

A mounting method for mounting an electrode assembly on a plasma etching apparatus includes inserting alignment pins in apertures of the plasma etching apparatus. Apertures of the electrode assembly are aligned relative to the alignment pins. The electrode assembly is then mounted on the plasma etching apparatus, passing the alignment pins through the apertures of the electrode assembly. Each alignment pin is then replaced with a locking arrangement.

16 Claims, 7 Drawing Sheets

METHOD FOR MOUNTING ELECTRODE ASSEMBLY

FIELD OF THE INVENTION

The present invention relates to equipment for performing plasma etching of semiconductor devices. More particularly, the present invention relates to the installation of electrode assemblies used in conjunction with such equipment.

BACKGROUND

As demand has grown for increasingly compact integrated circuit devices, plasma etching has been used to etch patterns on wafers with a high degree of precision. In a typical plasma etching process, a gas in an etching chamber is excited to a plasma state using radio frequency energy. With the wafer placed on an electrode, ions emerging from the plasma are accelerated towards the wafer. When the ions reach the wafer, they etch away surfaces that are not protected by a resist mask.

To realize the potential for high resolution etching using a plasma etching process, it is desirable to maintain a considerable degree of control over certain variables in the process. These variables include, for example, the process temperature, radio frequency power, and the composition of the etching gas. Of particular importance is the precise alignment of the electrode assemblies in the etching chamber.

Conventional electrode alignment techniques, such as visual inspection, have often been characterized by a lack of precision and a lack of repeatability. Accordingly, it has been particularly difficult to align the electrode assemblies consistently and properly. When the electrode assemblies are improperly aligned, poor etch uniformity and particle generation can result.

SUMMARY OF THE INVENTION

According to one embodiment, the present invention is directed to a mounting method for mounting an electrode assembly on a plasma etching apparatus. The mounting method includes inserting each of a plurality of alignment pins in a respective one of a plurality of apertures in the plasma etching apparatus. A plurality of apertures in the electrode assembly are aligned relative to the alignment pins. The electrode assembly is then mounted on the plasma etching apparatus, passing the alignment pins through the apertures of the electrode assembly. Each alignment pin is then replaced with a locking arrangement.

Another embodiment of the present invention is directed to an alignment pin for use in mounting an electrode assembly in a plasma etching apparatus. The alignment pin has a slotted head and a tapered body portion. The tapered body portion tapers from a first diameter at the slotted head to a second, larger, diameter at a first distance away from the slotted head. A non-tapered body portion extends from the tapered body portion. A distal end portion is configured to be inserted into a corresponding aperture of the plasma etching apparatus.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

These and other aspects and advantages of the present invention will become apparent upon reading the following detailed description and upon reference to the drawings, in which.

Figure 1:
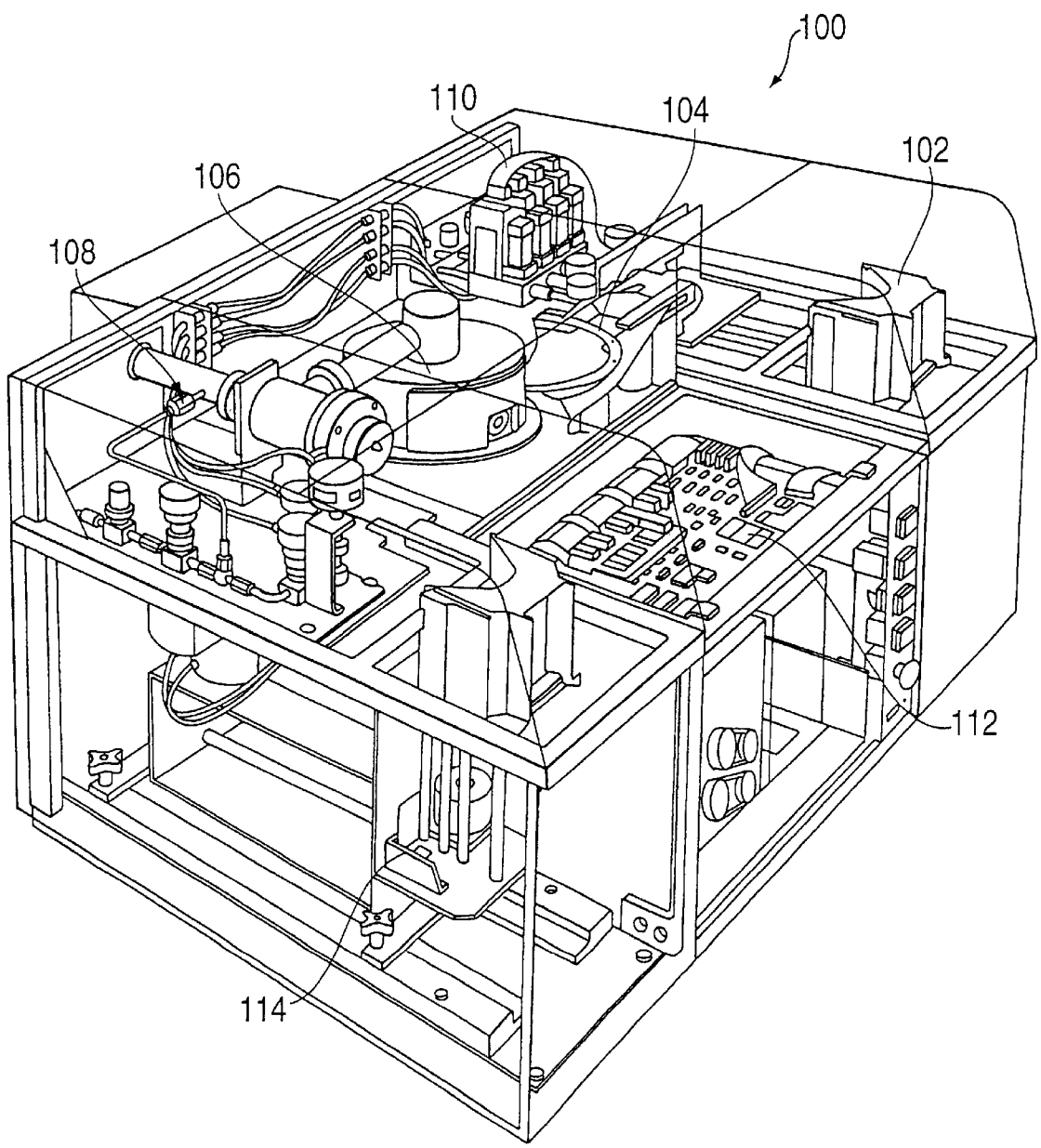
FIG. 1 is a cutaway view of a plasma etching apparatus in which an electrode assembly is mounted, according to an aspect of the present invention.

The invention is amenable to various modifications and alternative forms. Specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems and arrangements in which an electrode assembly is mounted in a plasma etching arrangement. The invention has been found to be particularly advantageous in environments in which precise alignment of the electrode assembly relative to the plasma etching apparatus is critical. An appreciation of various aspects of the invention can be gained through a discussion of various application examples operating in such environments.

Referring now to the drawings, FIG. 1 illustrates a plasma etching device 100. The plasma etching, device 100 can be implemented using, for example, a Tegal 901 or 903-type plasma etcher. A wafer receiver 102 receives a wafers that are to be etched by the plasma etching device 100. Individual Wafers are delivered by a wafer transport device 104 to an etching chamber 106. In the etching chamber 106, gas is delivered at high pressure by a pressure vacuum module 108. A gas delivery control system 110 regulates the delivery of gas into the etching chamber 106. The gas is then driven into the plasma state by a pair of electrode assemblies (not shown) in the etching chamber 106. The plasma thus formed etches selected regions of the wafer, e.g., regions not protected by a resist mask, to form circuit patterns. A microprocessor 112 controls the etching process. After the wafer is etched, it is transported out of the plasma etching device 100 by a wafer sender 114.

Figure 2:
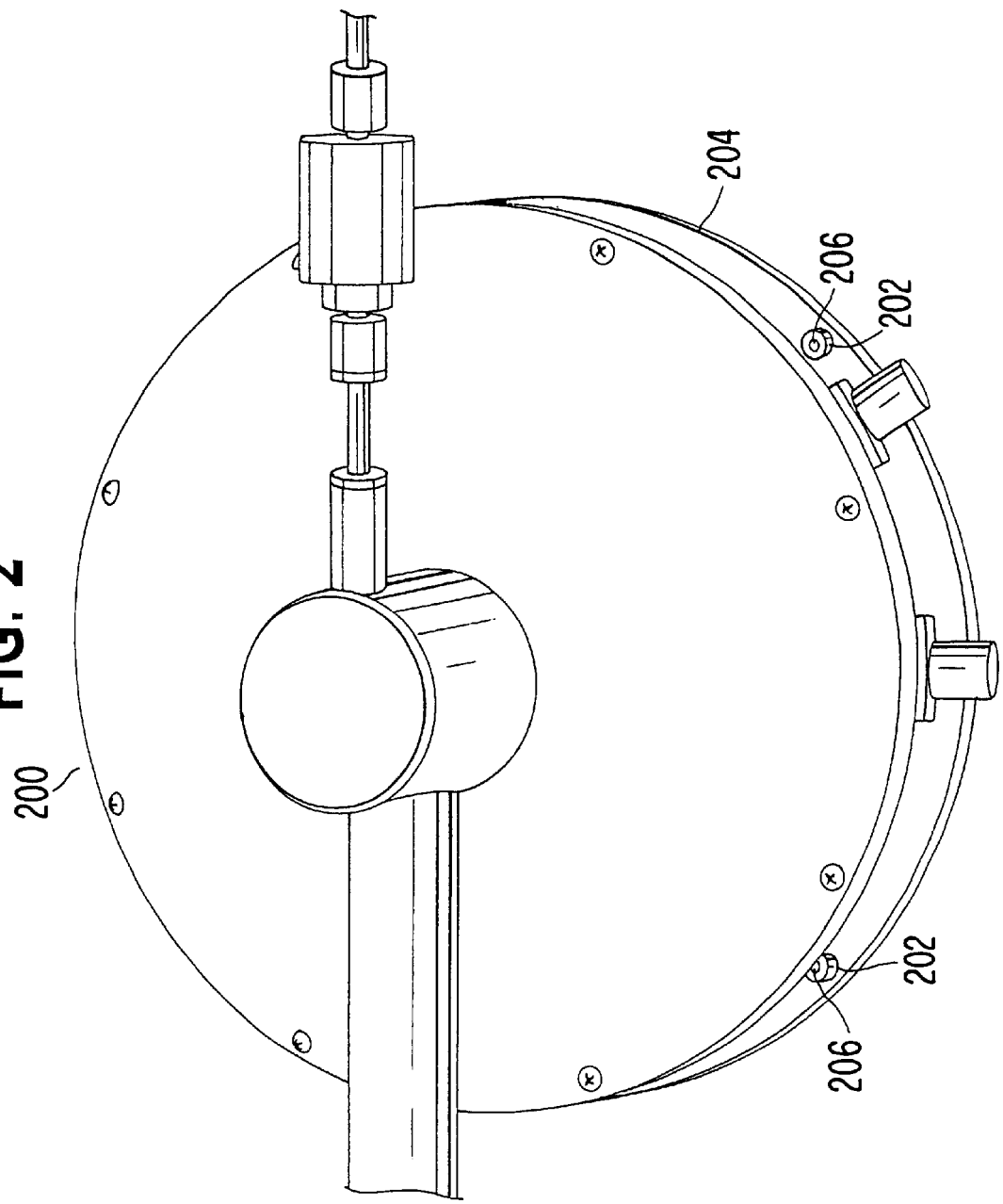
FIG. 2 is a top view of an electrode assembly mounted in a plasma etching apparatus, according to an aspect of the present invention.
Figure 3:
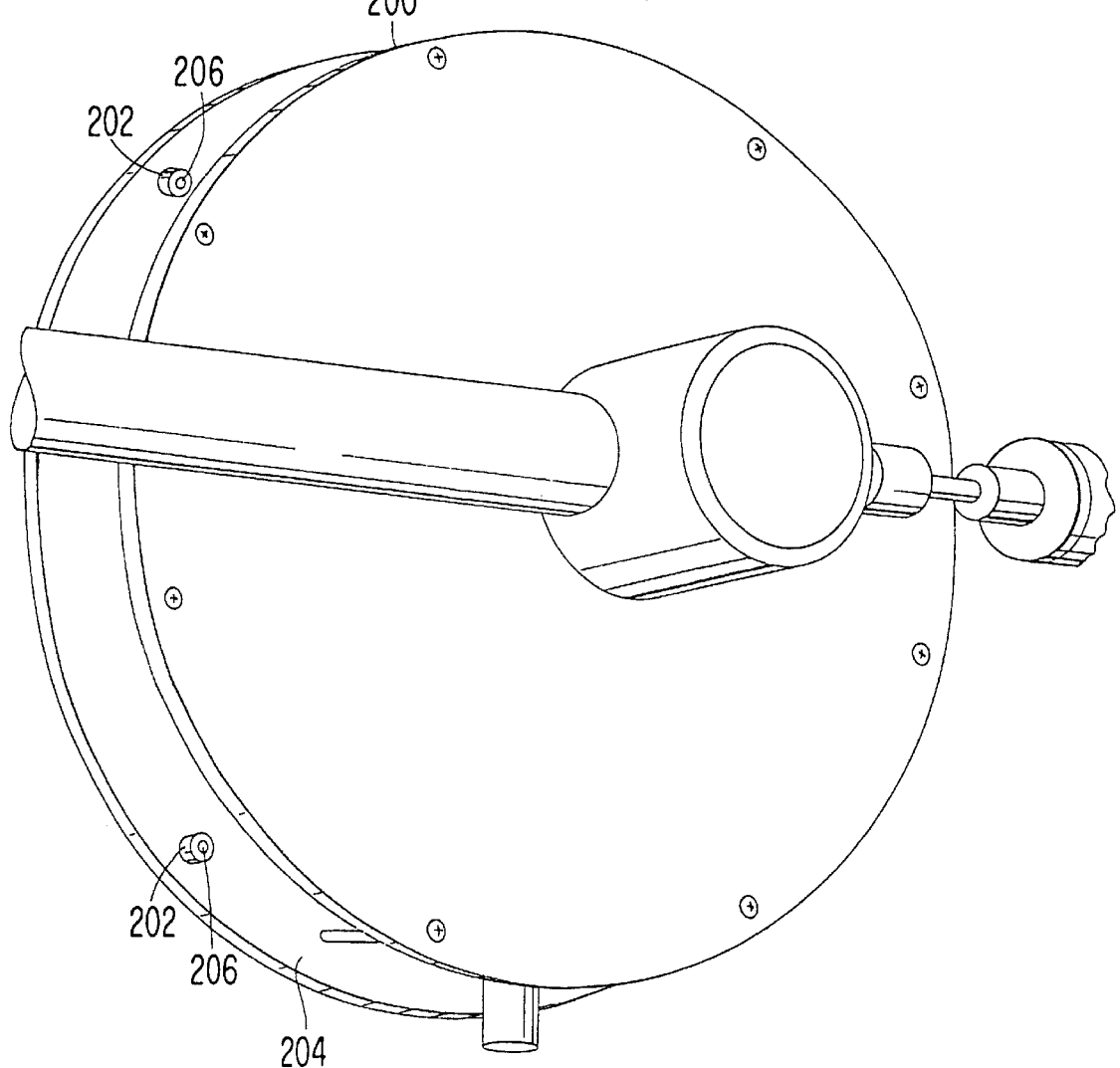
FIG. 3 is another top view of an electrode assembly mounted in a plasma etching apparatus, according to an aspect of the present invention.

FIGS. 2 and 3 illustrate top views of an electrode assembly 200 that forms part of the etching chamber. The electrode assembly 200 has a plurality of apertures 202 disposed around the circumference of its base plate 204. The apertures 202 are sized to accept locking bolts 206, which secure the electrode assembly 200 to the etching chamber. The locking bolts 206, in turn, are secured in the aperture 202.

Figure 4:
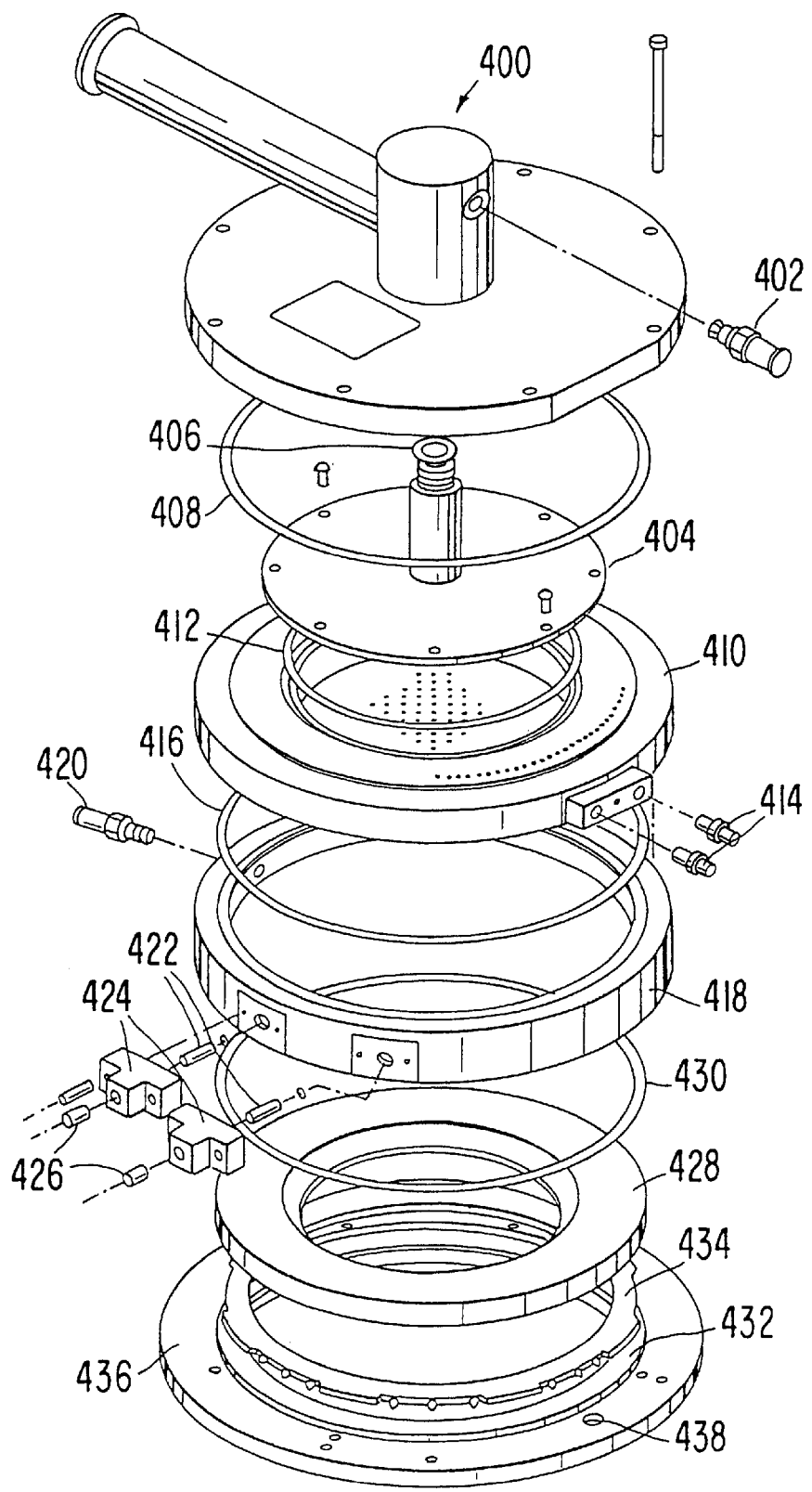
FIG. 4 is an exploded view of an electrode assembly configured to be mounted in a plasma etching apparatus, according to an aspect of the present invention.

An exploded view of the electrode assembly 200 is illustrated in FIG. 4. The electrode assembly 200 includes a chamber top plate 400, in which a port fitting 402 is installed. The port fitting 402 can be implemented using, for example, a TGL 1107-type part. An electrode top plate 404 is located below the chamber top plate 400 and is separated from it by O-rings 406 and 408. These O-rings can be implemented using 1002 and 1105-type O-rings, respectively, commercially available from Tegal. A TGL 1026-type electrode shower head 410 is located below the electrode top plate 404, separated by a TGL 1104-type O-ring 412. The electrode shower head 410 is fitted with a pair of FIT 486-type water port fittings 414, which permit the ingress and egress of water into the electrode shower head 410.

A TGL 1105-type O-ring 416 separates the electrode shower head 410 from a chamber body 418, which is fitted with a TGL 1107-type port fitting 420. A pair of TGL 1031-type sapphire rods 422 are disposed around the perimeter of the chamber body 418, held in place by retainers 424. Knurled nuts 426 secure the retainers 424 to the chamber body 418.

Below the chamber body 418, a TGL 1030-type ceramic insulating ring 428 is disposed, which acts as an RF ground or shield and prevents RF energy from grounding to the top plate of the system. The ceramic insulating ring 428 is separated from the chamber body 418 by a TGL 1024-type O-ring 430. A ground ring 432, located below the ceramic insulating ring 428, is held in place by a TGL 113-type ground ring retainer 434. A chamber base 436 forms the bottom of the electrode assembly 200 and is located on a top surface of the etching chamber.

The chamber base 436 has a plurality of apertures, one of which is depicted at reference numeral 438. The apertures 438 are sized to accept locking bolts, which secure the electrode assembly 200 to the top of the etching chamber. The locking bolts are secured.

To ensure proper alignment of the electrode assembly 200 with respect to the etching chamber, alignment pins (not shown) are installed, e.g., screwed, in the apertures 438. The electrode assembly 200 is then mounted on the alignment pins, ensuring accurate alignment. Each alignment pin is removed in turn and replaced with a locking bolt. The locking bolts prevent future movement of the electrode assembly 200. In a particular embodiment of the present invention, the pins are manufactured from a high quality stainless steel with the dimensions illustrated in FIGS. 6 and 7.

Figure 5:
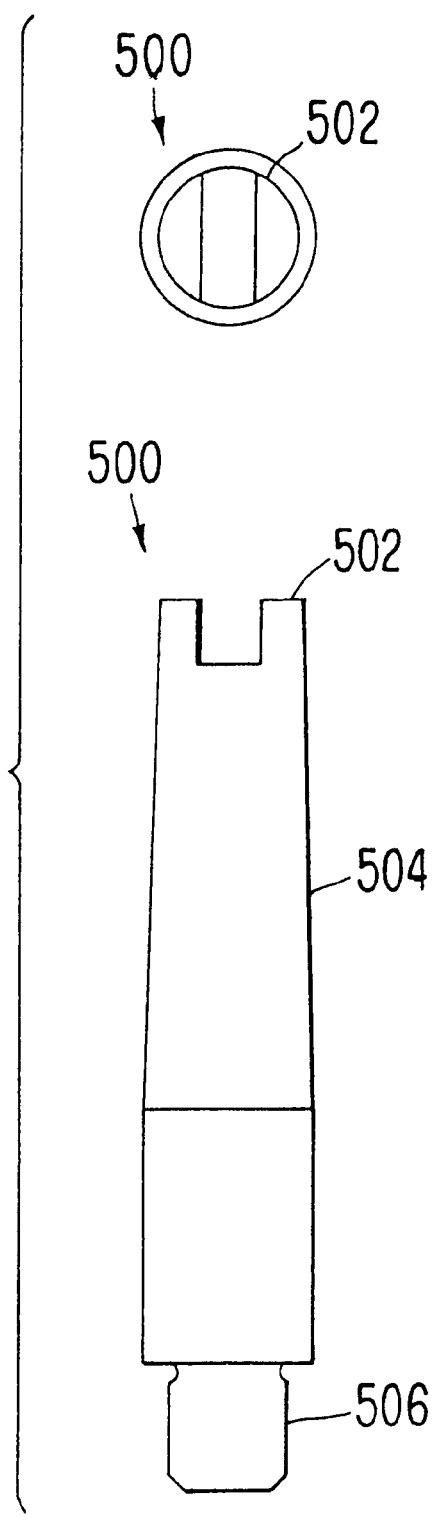
FIG. 5 illustrates top and side views of a pin for mounting an electrode assembly in a plasma etching apparatus, according to another aspect of the present invention.
Figure 6:
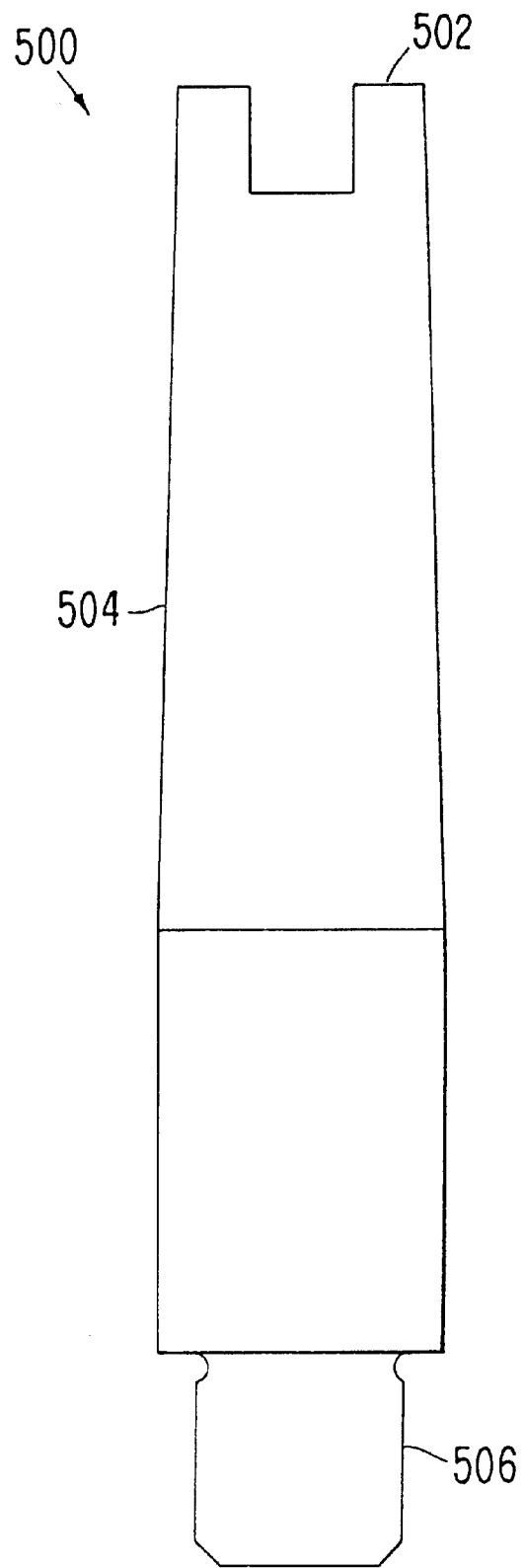
FIG. 6 is a side view of a pin for mounting an electrode assembly in a plasma etching apparatus illustrating example dimensions according to a particular embodiment of the present invention.
Figure 7:
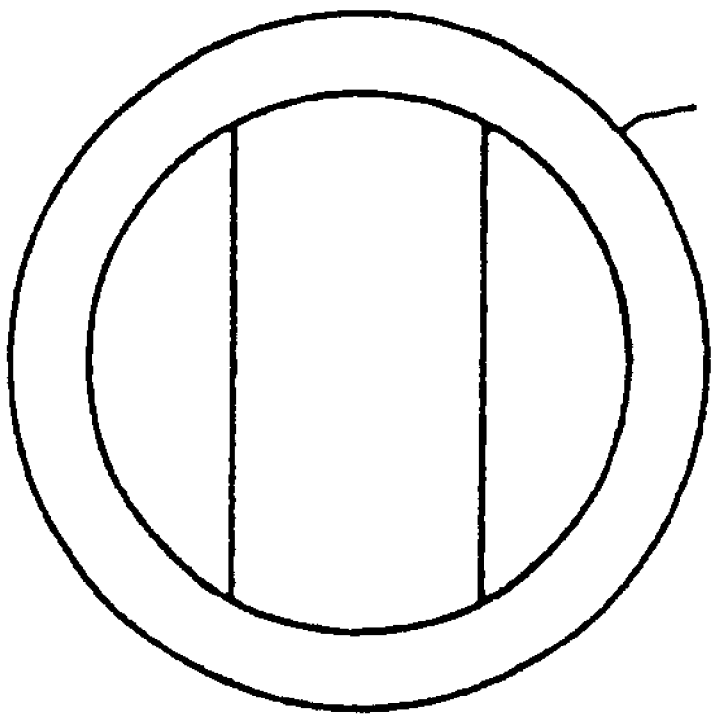
FIG. 7 is a top view of a pin for mounting an electrode assembly in a plasma etching apparatus illustrating example dimensions according to a particular embodiment of the present invention.

FIG. 5 illustrates top and side views of an alignment pin 500 that is used to align the electrode assembly with respect to the etching chamber. FIGS. 6 and 7 illustrate exemplary dimensions, in inches, of the alignment pin 500, according to a particular embodiment of the present invention. As depicted in FIG. 5, the alignment pin 500 has a slotted head 502. The head 502 is configured to receive a standard slotted screwdriver to facilitate installation into the electrode assembly. The alignment pin 500 also features a body 504, which, according to one embodiment of the present invention, is tapered to facilitate mounting the electrode assembly on the alignment pin 500. A distal end 506 of the body 504 is sized to fit in an aperture of the chamber base. The distal end 506 is threaded for a more secure fit into the aperture. The threads on the distal end 506 are of a standard size, such as ¼" in diameter and 20 threads per inch.

The various embodiments described above are provided by way of illustration only and should not be construed to limit the invention. Those skilled in the art will readily recognize various modifications and changes that can be made to these embodiments without strictly following the exemplary embodiments and applications illustrated and described herein, and without departing from the true spirit and scope of the present invention, which is set forth in the following claims.

What is claimed is:

1. A method of mounting an electrode assembly on a plasma etching apparatus, the mounting method comprising:
   inserting each of a plurality of alignment pins in a respective one of a plurality of apertures in the plasma etching apparatus such that each alignment pin extends from one of said plurality of apertures and has a central axis that extends along an entire length of that alignment pin and that passes through a center of said one of said plurality of apertures;
   aligning a plurality of apertures in the electrode assembly relative to the alignment pins such that said central axis of each of said alignment pins extends through a center of one of said plurality of apertures in said electrode assembly;
   mounting the electrode assembly on and in proper alignment with the plasma etching apparatus by passing the alignment pins through the apertures of the electrode assembly; and
   replacing each of the alignment pins with a fastener.

2. A mounting method, according to claim 1, further comprising screwing the alignment pins into the apertures of the plasma etching apparatus.

3. A mounting method, according to claim 1, wherein at least one alignment pin has a slotted head.

4. A mounting method, according to claim 1, wherein at least one alignment pin has a tapered body.

5. A mounting method, according to claim 1, wherein at least one alignment pin has a threaded distal end.

6. A mounting method, according to claim 1, wherein at least one alignment pin has an unthreaded distal end.

7. A mounting method, according to claim 1, wherein at least one alignment pin is formed from steel.

8. A mounting method, according to claim 1, wherein at least one alignment pin has a tapered portion having a length of 1,000 inches.

9. A mounting method, according to claim 1, wherein at least one alignment pin has a tapered portion tapering from a diameter of 0.280 inches at a first end thereof to a diameter of 0.340 inches at a second end thereof.

10. A mounting method, according to claim 1, wherein at least one alignment pin has a slotted portion having a slot having a width of 0.125 inches.

11. A method of mounting an electrode assembly on a plasma etching apparatus, the method comprising aligning and mounting said electrode assembly on said plasma etching apparatus by placing alignment pins inserted in apertures in said plasma etching apparatus through corresponding apertures in said electrode assembly.

12. The method of claim 11, further comprising replacing each of the alignment pins with a locking bolt to secure said electrode assembly to said plasma etching apparatus.

13. The method of claim 11, further comprising screwing said alignment pins into said apertures of said plasma etching apparatus.

14. The method of claim 11, wherein said alignment pins have a threaded distal end for screwing into said apertures of said plasma etching apparatus.

15. The method of claim 11, wherein said alignment pins have slotted heads.

16. The method of claim 11, wherein said alignment pins have a tapered body.

* * * * *